(12) United States Patent
Hekmatshoartabari et al.

(10) Patent No.: US 10,593,744 B2
(45) Date of Patent: Mar. 17, 2020

(54) MULTIPLE SUBTHRESHOLD SWING CIRCUIT AND APPLICATION TO DISPLAYS AND SENSORS

(71) Applicant: International Business Machines Corporation, Armonk, NY (US)

(72) Inventors: Bahman Hekmatshoartabari, White Plains, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/431,846

(22) Filed: Jun. 5, 2019

(65) Prior Publication Data

US 2019/0288050 A1 Sep. 19, 2019

Related U.S. Application Data

(63) Continuation of application No. 16/431,012, filed on Jun. 4, 2019.

(51) Int. Cl.
| | | |
|---|---|---|
| *H01L 29/08* | (2006.01) | |
| *H01L 27/32* | (2006.01) | |
| *H01L 29/10* | (2006.01) | |
| *H01L 29/16* | (2006.01) | |
| *H01L 29/808* | (2006.01) | |
| *H01L 29/06* | (2006.01) | |

(52) U.S. Cl.
CPC ...... *H01L 27/3269* (2013.01); *H01L 29/1066* (2013.01); *H01L 29/1604* (2013.01); *H01L 29/8086* (2013.01); *H01L 29/0649* (2013.01)

(58) Field of Classification Search
CPC . H01L 27/3269; H01L 27/098; H01L 31/028; H01L 31/1126; H01L 29/66893; H01L 2924/13062
See application file for complete search history.

(56) References Cited

U.S. PATENT DOCUMENTS

| | | | | |
|---|---|---|---|---|
| 5,008,565 | A * | 4/1991 | Taylor | H03H 11/04 327/543 |
| 2014/0361303 | A1* | 12/2014 | Chen | H01L 27/0623 257/66 |
| 2015/0206947 | A1* | 7/2015 | Hekmatshoartabari | H01L 29/8086 257/66 |

* cited by examiner

*Primary Examiner* — Matthew E. Gordon
(74) *Attorney, Agent, or Firm* — L. Jeffrey Kelly, Esq.; Hoffmann & Baron, LLP

(57) ABSTRACT

An apparatus includes transistor and a set of one or more serially-connected diodes coupled to the transistor. The transistor includes a gate, and first and second terminals. A first diode in the set of serially-connected diodes has a first terminal connected to the second terminal of the transistor. At least one of the diodes includes a first layer including silicon having a first type of carrier as its majority carrier, a first terminal, and a second terminal. The first terminal includes a second layer formed on the first layer, a third layer comprising amorphous hydrogenated silicon having a second type of carrier as its majority carrier formed on the second layer, and a conductive layer formed on the third layer. The second terminal includes a fourth layer comprising crystalline hydrogenated silicon of the first carrier type formed on the first layer, and a conductive layer formed on the fourth layer.

8 Claims, 6 Drawing Sheets

MULTIPLE SUBTHRESHOLD SWING CIRCUIT AND APPLICATION TO DISPLAYS AND SENSORS

CROSS-REFERENCE TO RELATED APPLICATIONS

This application is a continuation of U.S. patent application Ser. No. 16/431,012, filed Jun. 4, 2019, which in turn is a continuation of U.S. patent application Ser. No. 15/346,546, filed Nov. 8, 2016, having the same title and inventors as the present application, the disclosure of which is hereby incorporated by reference herein in its entirety for all purposes.

BACKGROUND OF THE INVENTION

The present invention relates generally to electronic circuits, and more particularly to field-effect transistors with applications to displays and sensors.

Displays and sensors, such as touchscreens in smartphones, are part of interfaces for interacting with many electronic devices. As an example, an OLED (organic light-emitting diode) display may include an array of TFT (thin-film transistor) pixel circuits, where each pixel circuit includes an OLED controllable by one or more select lines and one or more data lines. In a typical pixel circuit, a transistor, such as a TFT FET (field-effect transistor), when switched on provides drive current to its associated OLED. Such a transistor may be termed a driver TFT or driver transistor.

In some applications, such as high-resolution displays, it is desirable to reduce the dimensions of the pixels. In general, as the dimensions of a pixel (and therefore the dimensions of its OLED) are reduced, less drive current is needed for the OLED, and therefore to reduce power dissipation and improve performance it can be desirable for the driver transistor to operate in its subthreshold region. Furthermore, in some applications it is desirable to control the brightness of an OLED with a high precision, e.g., to generate a large number of distinct brightness levels. This may be achieved by controlling the gate-to-source voltage of the driver TFT so as to vary the drain current of the driver TFT as it is operating in its subthreshold region. A driver TFT with a relatively large subthreshold swing can be desirable because less demand is placed upon the devices and circuits used to accurately control its gate-to-source voltage.

BRIEF SUMMARY

Principles of the invention, in accordance with one or more embodiments thereof, provide circuits with relatively large subthreshold swings, suitable for implementation in displays and sensors.

In one aspect, an embodiment includes a JFET (junction field-effect transistor) and a set of one or more serially connected diodes connected to the JFET. The JFET includes a first layer comprising silicon having a first type of carrier as its majority carrier; a gate comprising a second layer formed on the first layer, the second layer comprising intrinsic amorphous hydrogenated silicon, a third layer formed on the second layer, the third layer comprising amorphous hydrogenated silicon having a second type of carrier as its majority carrier, and a conductive layer formed on the third layer. The JFET also includes a first terminal and a second terminal, each of the first and second terminals comprising a fourth layer formed on the first layer, the fourth layer comprising crystalline hydrogenated silicon having the first type of carrier as its majority carrier, and a conductive layer formed on the fourth layer. Each diode in the set of the one or more serially connected diode has a first terminal and a second terminal, wherein a first diode in the set of one or more serially connected diodes has a first terminal connected to the second terminal of the JFET.

In another aspect, an embodiment includes a transistor comprising a gate, a first terminal, and a second terminal. The embodiment also includes a set of one or more serially connected diodes, each diode having a first terminal and a second terminal, wherein a first diode in the set of one or more serially connected diodes has a first terminal connected to the second terminal of the transistor. A diode in the set of one or more serially connected diodes comprises a first layer comprising silicon having the first type of carrier as its majority carrier; a first terminal including a second layer formed on the first layer, the second layer comprising intrinsic amorphous hydrogenated silicon, a third layer formed on the second layer, the third layer including amorphous hydrogenated silicon having the second type of carrier as its majority carrier, and a conductive layer formed on the third layer; and a second terminal including a fourth layer formed on the first layer, the fourth layer including crystalline hydrogenated silicon having the first type of carrier as its majority carrier, and a conductive layer formed on the fourth layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Techniques of the present invention can provide substantial beneficial technical effects. By way of example only and without limitation, one or more embodiments may provide one or more of the following advantages: a relatively large subthreshold swing; power savings; decreased frame times in display applications; and a reduction in precision requirements or cost for devices and circuits used in driving the gate voltages of the driver TFTs.

These and other features and advantages of the present invention will become apparent from the following detailed description of illustrative embodiments thereof, which is to be read in connection with the accompanying drawings.

BRIEF DESCRIPTION OF THE SEVERAL VIEWS OF THE DRAWINGS

The following drawings are presented by way of example only and without limitation, wherein like reference numerals (when used) indicate corresponding elements throughout the several views, and wherein.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION

Principles of the present invention will be described herein in the context of circuits, systems and/or methods for providing drive current to an organic light-emitting diode (OLED). It is to be appreciated, however, that the specific circuits, systems and/or methods illustratively shown and described herein are to be considered exemplary as opposed to limiting. Moreover, it will become apparent to those skilled in the art given the teachings herein that numerous modifications can be made to the embodiments shown that are within the scope of the appended claims. That is, no limitations with respect to the embodiments shown and described herein are intended or should be inferred.

Figure 1A:
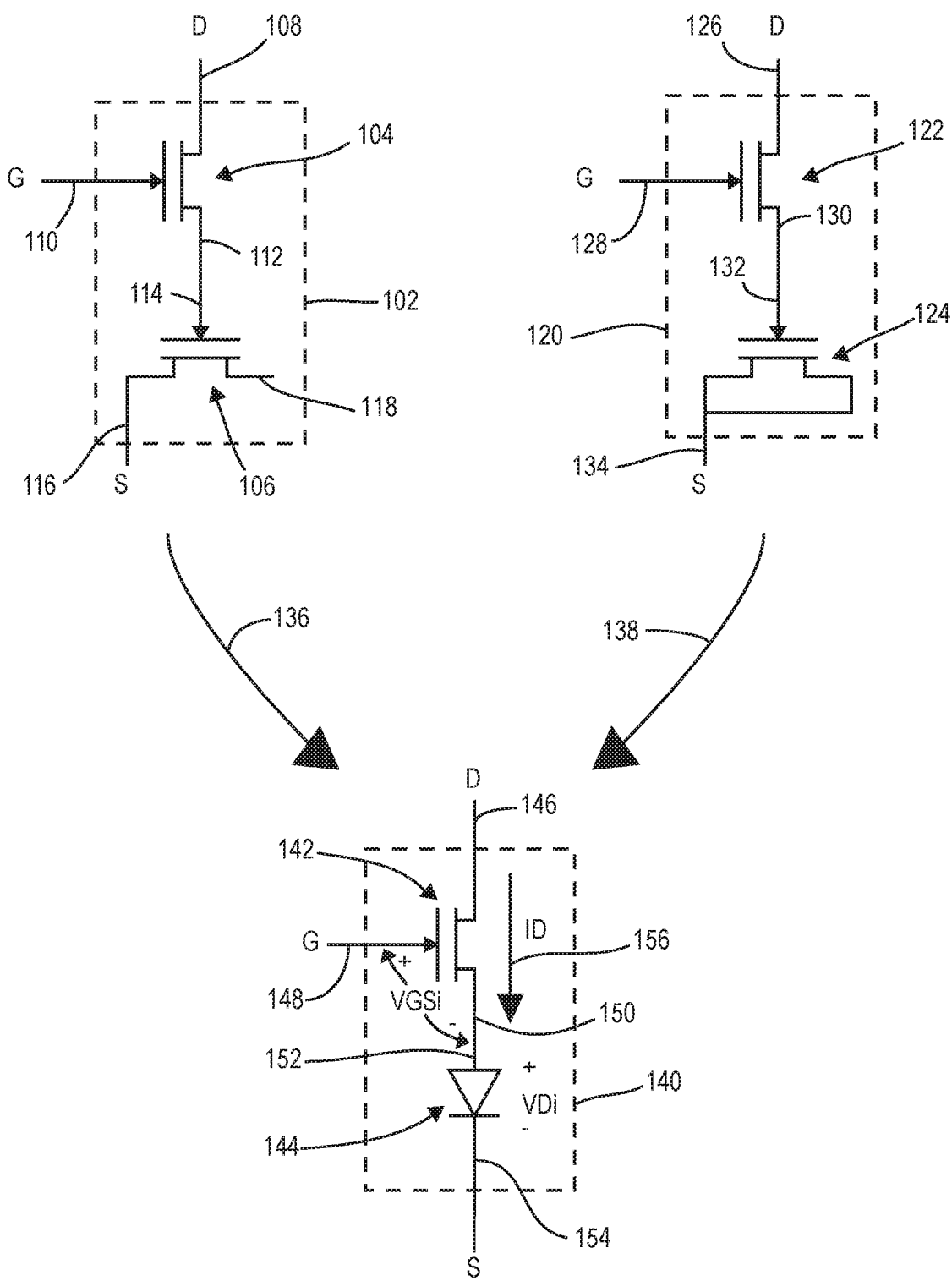
FIG. 1A is a circuit-level illustration of embodiments for n-channel transistors.

FIG. 1A is a schematic diagram depicting one or more illustrative circuits that may find application in systems where a large subthreshold swing may be desirable, according to one or more embodiments of the invention. The components within dashed rectangle 102 illustrate one particular embodiment comprising a transistor 104 and a transistor 106, where the transistor 106 provides a diode function. In a particular application, the transistors 104 and 106 may be TFTs. The transistor 104 may be, for example, a JFET (junction field-effect transistor), or a MOSFET (metal-oxide-semiconductor field-effect transistor), where a MOSFET is a particular example of an IGFET (insulated-gate field-effect transistor). The transistor 106 may be, for example, a JFET, but in some preferred embodiments it is not a MOSFET. The transistors illustrated in the embodiments of FIG. 1A are n-channel transistors, although embodiments of the invention are not limited to a specific conductivity type transistor.

The transistor 104 comprises a drain 108, a gate 110, and a source 112. The drain 108 and the source 112 may also be referred to, respectively, as a drain terminal and a source terminal, or each may be referred to as a source/drain or a terminal. The drain 108 and the source 112 may each have a similar or essentially identical structure, so that the particular designation as to whether such a terminal is a drain or a source follows usual circuit conventions well known to those of ordinary skill in the art. For example, with the transistor 104 an n-channel JFET, the drain terminal 108 would ordinarily be at a higher voltage then the source 112 when the device is part of an operating circuit. Because a metal-oxide-semiconductor (MOS) device is symmetrical in nature, and thus bi-directional, the assignment of source and drain designations in the MOS device is essentially arbitrary. Therefore, the source and drain of a given MOS device may be referred to herein generally as first and second source/drain, respectively, where "source/drain" in this context denotes a source or a drain. Similarly, the gate 110 may also be referred to as a gate terminal or as a terminal.

The transistor 106 comprises a gate 114 connected to the source 112, and a source 116. Again, the source 116 may be referred to as a source terminal, a source/drain, or simply as a terminal, where the designation of whether such a terminal is a source or drain depends upon the configuration of the circuit in which the device illustrated within the dashed rectangle 102 may find application. In the particular embodiment illustrated within the dashed rectangle 102, the transistor 106 also comprises another terminal, which may be termed a drain, a drain terminal, a source/drain, or simply a terminal, designated by the label 118. The drain 118 may be a floating terminal, or in some embodiments the transistor 106 may be fabricated so that there is only one such terminal—the source 116. Because the transistor 106 serves as a diode, the gate 114 may also be referred to as a terminal or an anode.

As illustrated in FIG. 1A, the drain 108 is labeled with a D, the gate 110 is labeled with a G, and the source 116 is labeled with an S. The labels D, G, and S represent the functional equivalents of a drain, gate, and source, respectively, where the combination of the transistors 104 and 106 illustrated within the dashed rectangle 102 provides the functional equivalent of a transistor having a relatively large subthreshold swing, where the resulting effective transistor has as its effective drain, gate, and source the drain 108, the gate 110, and the source 116, respectively.

The circuit components shown within the dashed rectangle 120 illustrate another embodiment comprising a transistor 122 and a transistor 124. Remarks regarding the transistors 104 and 106 are also applicable, respectively, to the transistors 122 and 124. However, in the embodiment represented by the dashed rectangle 120, the source/drain terminals of the transistor 124 are connected to each other. As illustrated in FIG. 1A, the transistor 122 comprises a drain 126, a gate 128, and a source 130. The transistor 124 comprises a gate 132 connected to the source 130, and a source 134. The effective transistor realized by the combination of the transistors 122 and 124 has, as for the embodiment illustrated within the dashed rectangle 102, a relatively large subthreshold swing with an effective drain provided by the drain 126, an effective gate provided by the gate 128, and an effective source provided by the source 134.

An arrow 136 and an arrow 138 pictorially represent that the circuit components within the dashed rectangle 140 represent an equivalent circuit to the particular embodiments illustrated within the dashed rectangles 102 and 120. The equivalent circuit within the dashed rectangle 140 comprises a transistor 142 and a diode 144. The transistor 142 comprises a drain 146, a gate 148, and a source 150. The diode 144 comprises an anode 152 connected to the source 150, and a cathode 154. Similar remarks regarding the transistors 104 and 122 are also applicable to the transistor 142.

The equivalent circuit represented by the dashed rectangle 140 has an effective drain provided by the drain 146, an effective gate provided by the gate 148, and an effective source provided by cathode 154.

For purposes of describing equations representing the I-V characteristic curves for the equivalent circuit within the dashed rectangle 140, the internal gate-to-source voltage for the transistor 142 is represented by the variable $V_{GSi}$ and the drain current of the transistor 142 is represented by the variable $I_D$. The voltage drop across the diode 144 is represented by the variable $V_{Di}$. The sign convention for these voltages is indicated in FIG. 1A, where an arrow 156 indicates the sign convention for the drain current.

The effective gate-to-source voltage of the equivalent circuit within the dashed rectangle 140 represents the effective gate-to-source voltages for the embodiments represented by the dashed rectangles 102 and 120. This voltage is taken as the potential difference between the gate 148 and the cathode 154.

Let $V_{GS}$ denote the effective gate-to-source voltage. Then, $$V_{GS} = V_{GSi} + V_{Di}.$$

(For a p-channel JFET, $-V_{GS} = -V_{GSi} + V_{Di}$.) For drain-to-source voltages much larger than KT/q (~26 mV at room-temperature), the drain-to-source voltage dependence of the drain current is negligible in the subthreshold regime and the gate-to-source voltage $V_{GSi}$ is given by $$V_{GSi} - V_p = \left(\frac{SS}{\ln 10}\right) \ln\left(\frac{I_D}{I_{D0}}\right),$$

where $V_p$ is the pinch-off voltage of a JFET, SS is the JFET subthreshold swing which may be defined as $(d \log I_{DS}/dV_{GS})^{-1}$, and $I_{D0}$ is the JFET saturation current (i.e. at pinch-off). For a p-channel JFET, the left hand side of the above-displayed equation is $-V_{GSi} + V_p$. The diode voltage drop for the diode-connected transistor, i.e., the diode 144 in the equivalent circuit within the dashed rectangle 140, is $$V_{Di} = n\left(\frac{KT}{q}\right) \ln\left(\frac{I_D}{I_0}\right),$$

where n is an ideality factor of the gate p-n junction and $I_0$ is the reverse saturation current of the gate p-n junction. The above-displayed equation also holds for a p-channel JFET. The above expressions yield the I-V characteristic expression:

$$V_{GS} - \left[V_p + n\left(\frac{KT}{q}\right)\ln\left(\frac{I_{D0}}{I_0}\right)\right] = \left\{\left[SS + n\left(\frac{KT}{q}\right)\ln 10\right]/\ln 10\right\} \ln\left(\frac{I_D}{I_{D0}}\right).$$

For a p-channel JFET, the left-hand side of the above-displayed equation is $$-V_{GS} + \left[V_p - n\left(\frac{KT}{q}\right)\ln\left(\frac{I_{D0}}{I_0}\right)\right].$$

In the above-displayed expression for the n-channel JFET, the quantity $$\left[V_p + n\left(\frac{KT}{q}\right)\ln\left(\frac{I_{D0}}{I_0}\right)\right]$$

may be interpreted as an effective pinch-off voltage, and the quantity $$\left[SS + n\left(\frac{KT}{q}\right)\ln 10\right]$$

may be interpreted as an effective subthreshold swing. For a p-channel JFET, the pinch-off voltage is $$\left[V_p - n\left(\frac{KT}{q}\right)\ln\left(\frac{I_{D0}}{I_0}\right)\right],$$

where the expression for the effective subthreshold swing is the same as for the n-channel JFET as displayed above.

For some embodiments, additional diodes may be connected in series with the transistor 106 or the transistor 124, where in the equivalent circuit additional diodes are connected in series with the diode 144. Let M denote the number of such diodes. If the M diodes are identical and therefore have the same ideality factor n and reverse saturation current $I_0$, then the above-displayed expressions for the equivalent circuit are modified by replacing n with nM. For example, the effective pinch-off voltage and the effective subthreshold swing of the equivalent circuit for the n-channel JFET are given by $$\left[V_p + nM\left(\frac{KT}{q}\right)\ln\left(\frac{I_{D0}}{I_0}\right)\right] \text{ and } \left[SS + nM\left(\frac{KT}{q}\right)\ln 10\right],$$

respectively. In the general case where the M diodes are not identical, these expressions are modified to $$\left[V_p + \left(\frac{KT}{q}\right)\sum_{i=1}^{M} n_i \ln\left(\frac{I_{D0}}{I_{0,i}}\right)\right] \text{ and } \left[SS + \left(\frac{KT}{q}\right)\ln 10 \sum_{i=1}^{M} n_i\right],$$

where $n_i$ and $I_{0,i}$ denote the ideality factor and saturation current of the i-th diode, respectively.

Figure 1B:
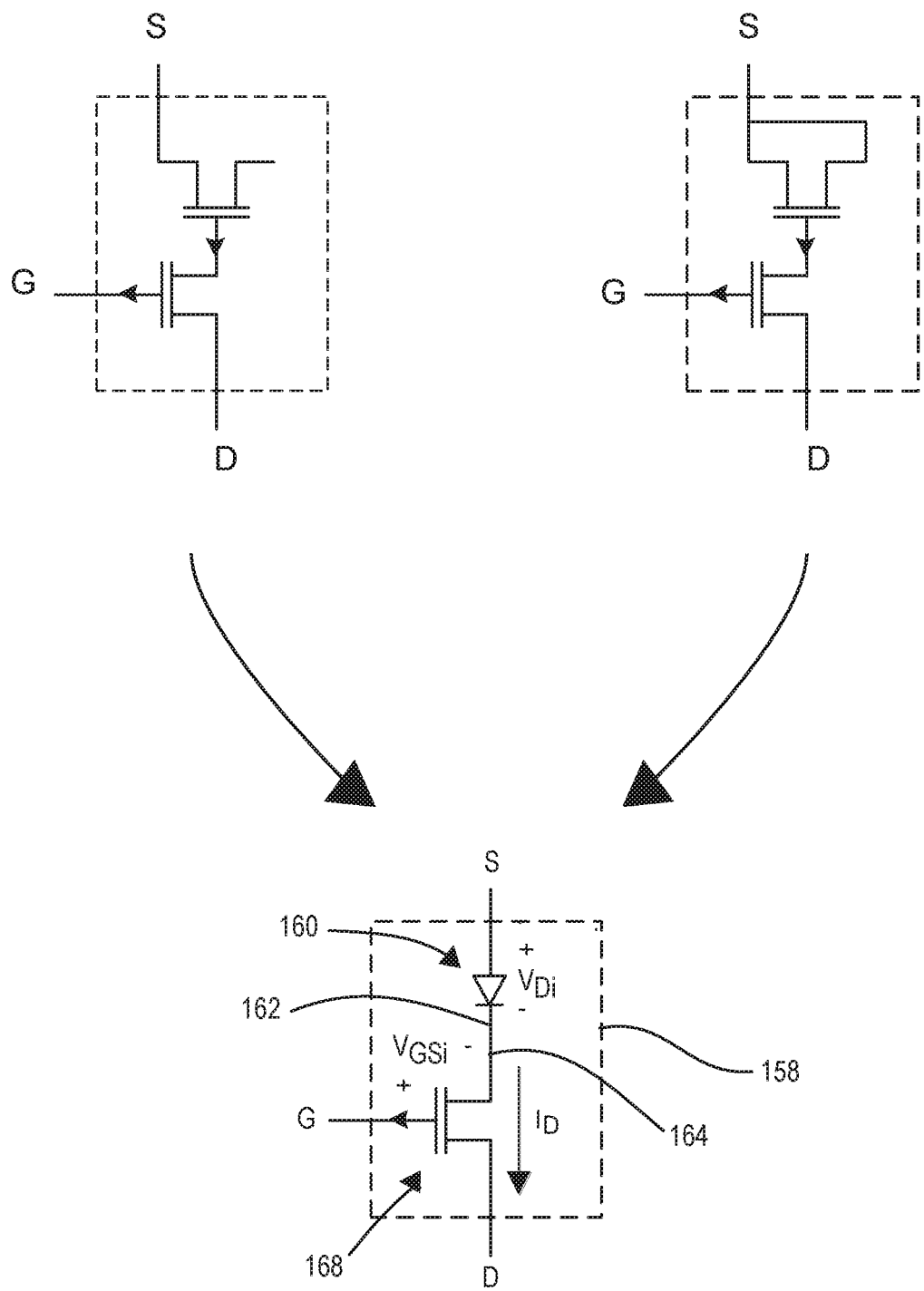
FIG. 1B is a circuit-level illustration of embodiments for p-channel transistors.

FIG. 1B illustrates circuit components similar to those illustrated in FIG. 1A, but where the transistors are p-channel transistors. The effective sources, drains, and gates in FIG. 1B are labeled as S, D, and G, respectively. The equivalent circuit within a dashed rectangle 158 indicates algebraic signs for the various voltages, where an equivalent circuit diode 160 has a cathode 162 connected to a source 164 of a transistor 168. Other connections among the various circuit components illustrated in FIG. 1B are similar to that of FIG. 1A, and consequently need not be described in detail.

Figure 2:
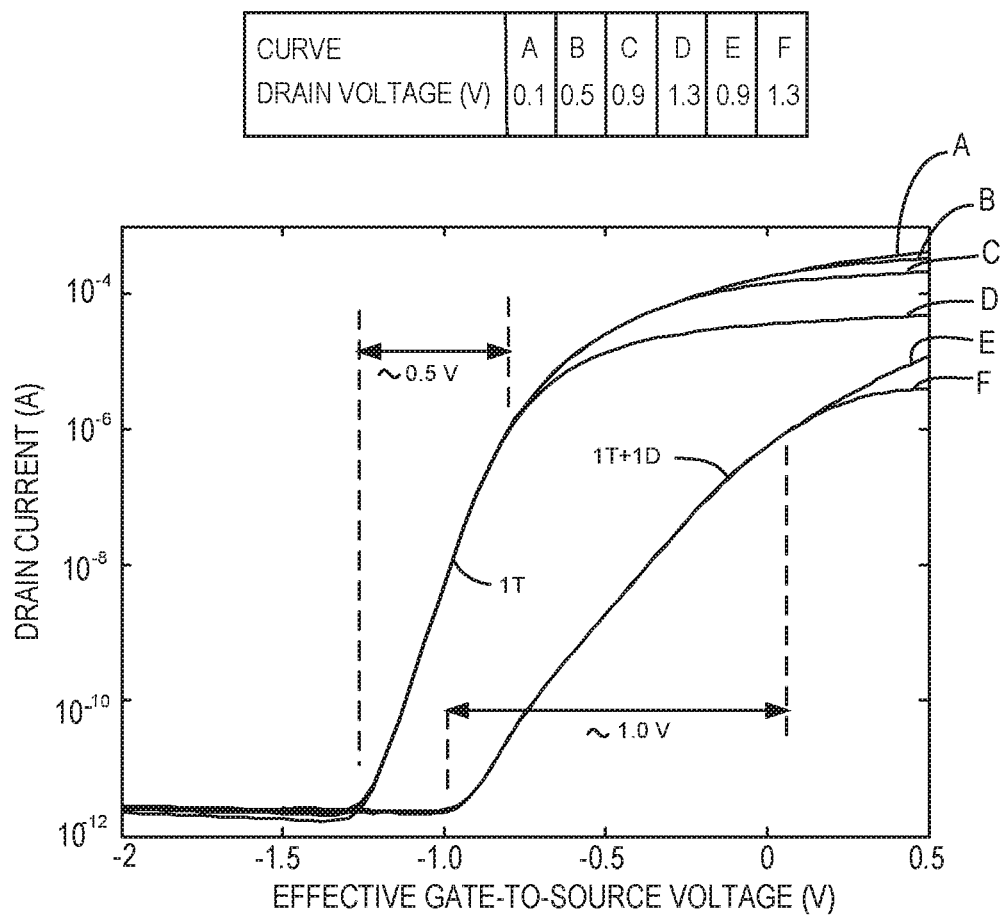
FIG. 2 illustrates a multiple subthreshold swings for the embodiments of FIG. 1.

FIG. 2 illustrates an exemplary I-V characteristic curve for an embodiment effective transistor with a doping concentration of about $10^{18}$ cm$^{-3}$. Six I-V characteristic curves, labeled A, B, C, D, E, and F, are presented illustrating drain current as a function of effective gate-to-source voltage for various values of the drain voltage $V_D$. From the legend illustrated in FIG. 2, the drain voltages for curves A, B, C, D, E, and F are, respectively, 0.1 V, 0.5 V, 0.9 V, 1.3 V, 0.9 V, and 1.3 V. The curves A, B, C, and D represent the case in which there is no diode (or diode-connected transistor), whereas the curves E and F represent the case in which there is only one diode (or diode-connected transistor).

The curves A, B, C, and D essentially coincide with one another over a substantial portion of the x-axis, and are represented collectively by the symbol 1T denoting that there is one transistor but no diode within the dashed rectangle 102 or 120, that is, the diode 144 is not present in the equivalent circuit. The swing (change) in effective gate-to-source voltage is about 0.5 V. The curves essentially coincide over the swing of the effective gate-to-source voltage.

The curves E and F essentially coincide with one another over a substantial portion of the x-axis, and are represented collectively by the symbol 1T+1D denoting that there is one transistor and only one diode within the dashed rectangle 102 or 120, that is, only one diode, e.g., the diode 144, is present in the equivalent circuit. The swing (change) in effective gate-to-source voltage is about 1.0 V. The curves essentially coincide over the swing of the effective gate-to-source voltage.

FIG. 2 illustrates that embodiments with one diode (or diode-connected transistor), e.g., the curves E and F, have larger values for their subthreshold swing than embodiments with no diode or diode-connected transistor (e.g., the curves A, B, C, and D). The above-displayed equations indicate that adding additional diodes to an embodiment should result in a larger value for the subthreshold swing. Also, adding in diodes (or diode-connected transistors) increases the swing of the effective gate-to-source voltage.

Figure 3A:
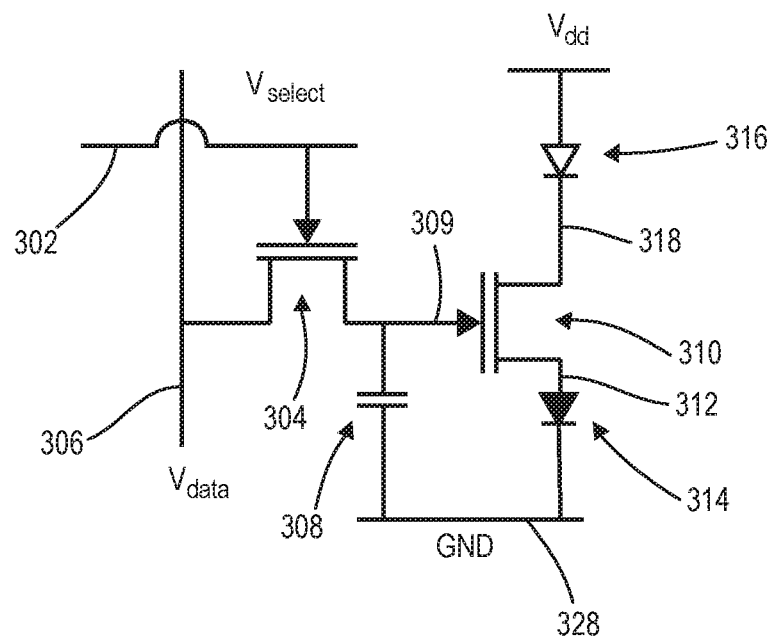
FIG. 3A illustrates a pixel circuit in which an embodiment of FIG. 1 may find application.
Figure 3B:
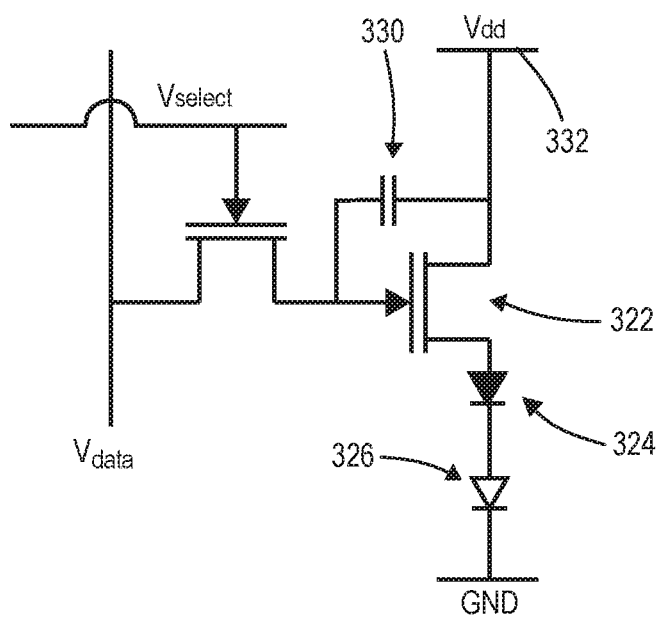
FIG. 3B illustrates a pixel circuit in which an embodiment of FIG. 1 may find application.

FIG. 3A and FIG. 3B illustrate pixel circuits in which embodiments may find application. Referring to FIG. 3A, a select line 302 when held HIGH turns on a transistor (n-channel JFET) 304 so that a data line 306 is coupled to a capacitor 308. This allows the capacitor 308 to be charged to some desired voltage. After charging, the select line 302 is held LOW so that the transistor 304 is off. The capacitor 308 is connected to a gate 309 of a driver transistor (n-channel JFET) 310 so that the voltage drop across the capacitor 308 determines the drive current provided by the driver transistor 310. A source 312 of the transistor 310 is connected to a diode 314, and an OLED 316 is connected to a drain 318 of the transistor 310. The diode 314 may be realized as a diode-connected transistor as discussed with respect to FIG. 1A.

With only one diode connected to the source 312 of the driver transistor 310, the expression for the effective subthreshold swing is $$\left[SS + n\left(\frac{KT}{q}\right)\ln 10\right].$$

Referring now to FIG. 3B, note that there are two diodes connected to a source 320 of a driver transistor (n-channel JFET) 322: a diode 324 and an OLED 326. As a result, the effective subthreshold swing is ($n_o$ denotes the ideality factor of the OLED)

$$\left[SS + (n + n_o)\left(\frac{KT}{q}\right)\ln 10\right].$$

The operation of the circuit of FIG. 3B is similar to that of FIG. 3A, but the capacitor 308 in FIG. 3A is connected to ground 328 whereas a capacitor 330 is connected to a voltage supply rail 332. The choice of whether to connect the capacitor in FIG. 3A or FIG. 3B to ground or the voltage supply rail is in theory arbitrary, although in practice there can be difficulty in fabricating a capacitor in parallel with an OLED.

Because the subthreshold swing of the circuit in FIG. 3B is larger than that of FIG. 3A, the drive current provided to the OLED 326 is relatively insensitive to small changes in charge stored on the capacitor 330 compared to that of FIG. 3A. That is, the drive current in the circuit of FIG. 3B is less sensitive to variations in the voltage drop across the capacitor 330 than is the drive current for the circuit of FIG. 3A to variations in the voltage drop across the capacitor 308.

Furthermore, because of the dependency of the effective subthreshold swing upon the number of diodes connected to the source of the driver transistor, as the number of diodes increases, the subthreshold swing increases in value. An advantage of a relatively large subthreshold swing is that high-performance circuits are not required for accurate adjustment of the drive current provided to the OLED. Accordingly, utilizing one or more diodes, for example the transistor 106 or the transistor 124 of FIG. 1A, as represented by the diode 144 in the equivalent circuit 140, in series with a transistor for sourcing drive current, such as the transistor 142 of the equivalent circuit 140, can lead to simpler circuits for accurately adjusting the drive current and resulting brightness in an OLED. The circuits illustrated in FIG. 3A and FIG. 3B are merely two examples in which embodiments may find application.

Figure 4:
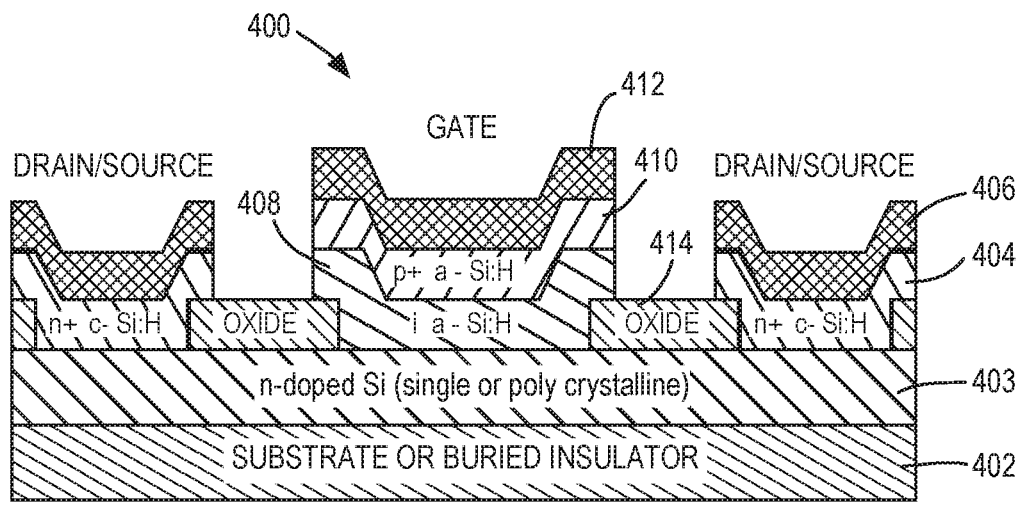
FIG. 4 illustrates a cross-sectional slice of an n-channel JFET according to an embodiment of FIG. 1.

FIG. 4 is a cross-sectional view depicting an exemplary JFET 400 that may be well suited for use in the circuits of FIG. 1A, according to an embodiment of the invention. Referring now to FIG. 4, beginning with a substrate 402, which may comprise buried oxide (BOX) or glass, a layer 403 comprising n-doped crystalline silicon is formed on the substrate 402. The crystalline silicon layer 403 may comprise single-crystalline or poly-crystalline silicon. In one example, the crystalline silicon layer 403 is comprised of low-temperature poly-silicon (LTPS) prepared by excimer laser annealing (ELA). In one example, the layer 403 is comprised of LTPS having a thickness in the range of 20 nm to 55 nm and a doping concentration in the range of $5\times10^{18}$ cm$^{-3}$ to $8\times10^{16}$ cm$^{-3}$. In one or more embodiments, the layer 403 may have a thickness of about 50 nm and an n-doping concentration of about $2\times10^{18}$ cm$^{-3}$, although it is to be appreciated that embodiments of the invention are not limited to a specific doping type or concentration.

A drain and a source of the JFET 400 are each formed on the layer 403, with each of the drain and source, in this embodiment, comprising an n$^+$-doped hydrogenated silicon layer 404, upon which is formed a conductive layer 406, which may be a metal layer, so as to provide an ohmic contact with the respective drain or source. In the embodiment of FIG. 4, the n$^+$-doped hydrogenated silicon layer 404 is grown epitaxially; therefore, a portion of the layer 404 grown on the crystalline silicon layer 403 is crystalline in structure and a portion grown on an oxide layer 414 is non-crystalline. A gate of the JFET 400 is formed on the layer 403 and includes an intrinsic amorphous hydrogenated silicon layer 408 upon which is formed a p$^+$-doped amorphous hydrogenated silicon layer 410 and a conductive (e.g., metal) layer 412 formed on the layer 410. The conductive layers 412 and 404 may be etched from the same conductive layer.

In an embodiment, the layer 410 may have a doping concentration in a range of about $10^{16}$ cm$^{-3}$ to $10^{21}$ cm$^{-3}$ and a thickness in a range of about 5 nm to 15 nm. The intrinsic amorphous hydrogenated silicon layer 408 may have a thickness in a range of about 2 nm to 100 nm. The hydrogenated silicon layers may comprise about 5 atomic % hydrogen to 40 atomic % hydrogen. The JFET 400 includes other layers, but for ease of description not all passivation and/or isolation layers are shown. The width of a JFET according to an embodiment may be about 5 μm, where the length is about 2 µm. It is to be understood, however, that embodiments of the invention are not limited to any specific dimensions.

Figure 5:
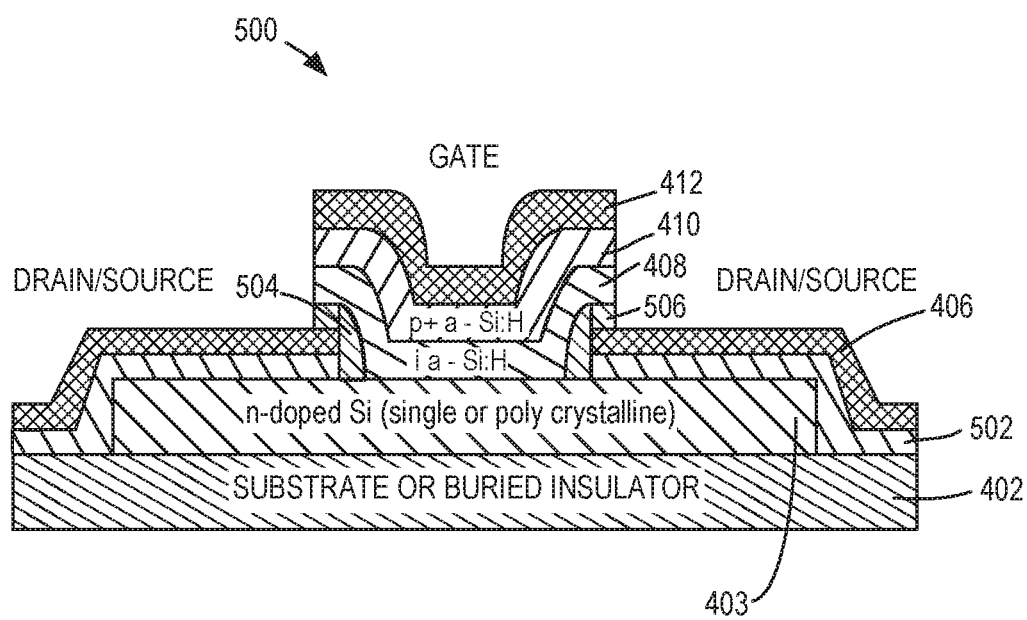
FIG. 5 illustrates a cross-sectional slice of another example of an n-channel JFET according to an embodiment of FIG. 1.

FIG. 5 is a cross-sectional view depicting an exemplary JFET 500 that also may be well suited for use in the circuits of FIG. 1A, according to an embodiment of the invention, where various numerals appearing in FIG. 4 have been used. The layer 502 in FIG. 5 comprises hydrogenated silicon that is crystalline on the surface and sidewalls of the layer 403, but amorphous elsewhere. The gate (i.e., the stack comprising the layers 408, 410, and 412) is separated from the source or drain with a spacer 504 in the horizontal direction (i.e., parallel to the substrate layer 402) and with a spacer 506 in the vertical direction. The spacers 504 and 506 are comprised of insulating materials, such as for example an oxide, and may be formed using conventional techniques, e.g., conformal deposition of an insulator followed by anisotropic etching.

Figure 6:
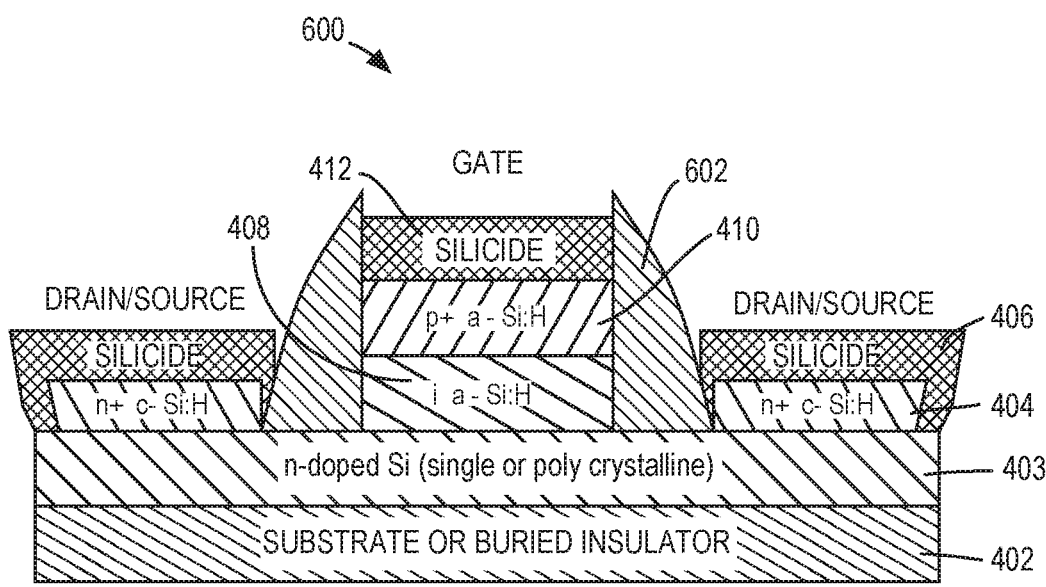
FIG. 6 illustrates a cross-sectional slice of another example of an n-channel JFET according to an embodiment of FIG. 1.

FIG. 6 is a cross-sectional view depicting an exemplary JFET 600 that also may be well suited for use in the circuits of FIG. 1A, according to an embodiment of the invention, where again various numerals appearing in FIG. 4 have been used. In FIG. 6, a spacer 602 is essentially the same as the spacer 504 in FIG. 5. The layer 404 can be grown using the same method as for the embodiments illustrated in FIG. 4 and FIG. 5, but the amorphous portion of the layer is etched selectively, e.g. in-situ, using a hydrogen plasma, leaving only the crystalline portion. In the embodiment of FIG. 6, the conductive layer 412 (part of the gate stack) comprises silicide and may be formed using conventional techniques, e.g., metal deposition followed by annealing to form silicide as a result of chemical reaction between metal and a Si containing layer (e.g., hydrogenated crystalline Si and hydrogenated amorphous Si) followed by wet etching of the unreacted portion (i.e., that portion in which silicide is not formed) of the metal.

FIGS. 4 through 6 each illustrate an n-channel JFET, but other embodiments may employ a p-channel JFET in place of an n-channel JFET. For such embodiments, in relation to the above description regarding an n-channel JFET, p-doped regions replace n-doped regions. Accordingly, a semiconductor doped with a donor or acceptor may be described as having a majority carrier of a first type or a second type; that is, having a first or second conductivity type, depending on the doping impurity type (n- or p-type). For example, doping with a donor leads to the type of majority carrier being an electron, where doping with an acceptor leads to the type of majority carrier being a hole.

In the above description, the source and drain for an n-channel or p-channel JFET are structurally similar to each other, so that the definition of whether a terminal is a source or drain depends upon the circuit configuration. Accordingly, a source or drain may be referred to as a terminal, or for example as a first terminal or second terminal.

Figure 7:
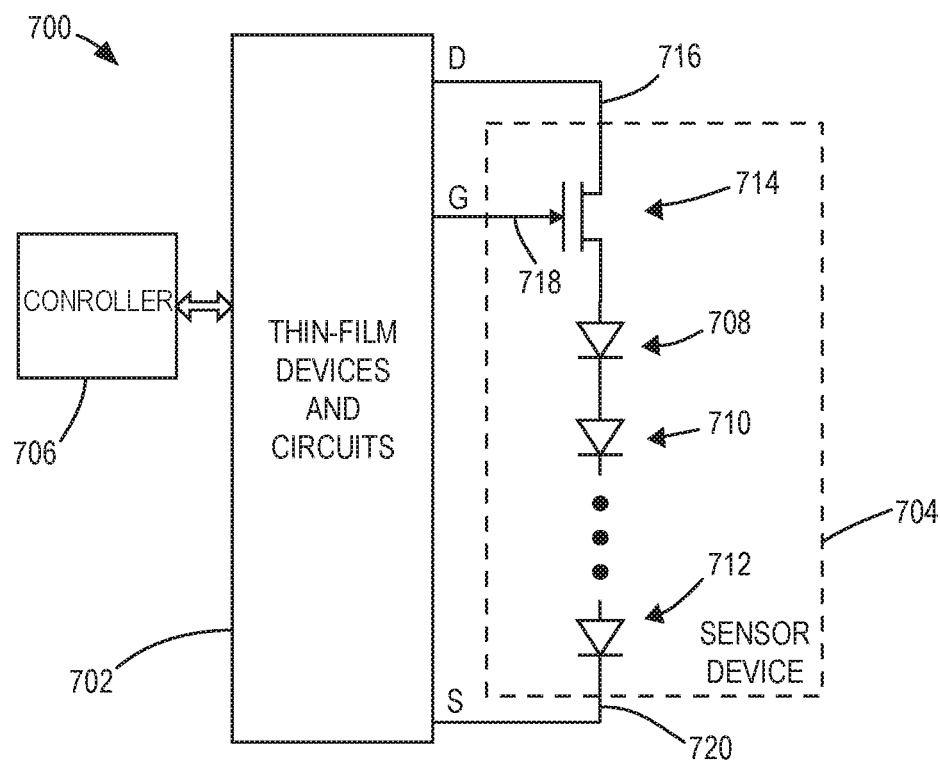
FIG. 7 illustrates one or more sensor devices in which an embodiment of FIG. 1 may find application.

FIG. 7 illustrates a system 700 in which an embodiment may find application. The system 700 includes one or more thin-film devices or circuits represented by a rectangle 702, one or more sensor devices within a dashed rectangle 704, and a controller 706 in communication with the thin-film devices or circuits 702. The one or more sensor devices 704 may be integrated with the thin film devices or circuits 702.

Illustrated within the one or more sensor devices 704 is a set of serially connected diodes, for example a diode 708, a diode 710, and a diode 712, connected in series with a transistor 714. The transistor 714 may be identified with the transistor 142 of the equivalent circuit 140 illustrated in FIG. 1A, and the set of serially connected diodes, e.g., the diodes 708, 710, and 712, may be identified with the diode 144 of the equivalent circuit 140. A drain 716 and a gate 718 of the transistor 714, and a cathode 720 of the diode 712, provide, respectively, an effective drain, gate, and source as discussed with respect to the embodiments of FIG. 1A.

In some embodiments, the set of serially connected diodes may consist of only one diode. Furthermore, some or all of the diodes may be realized as diode-connected transistors as described with respect to the embodiments of FIG. 1A. The transistor 714 and the serially connected diodes 708, 710, and 712 are illustrated as n-channel devices, but p-channel devices may be utilized.

Transistor 714 may be any one of several kinds of JFETs, for example the transistor 714 may be similar or identical in structure to any one of the embodiments described with respect to FIGS. 4-6. The transistor 714 may represent any one of a number of types of sensors. As examples, the transistor 714 may be an ion-sensitive transistor or a photosensitive transistor.

As discussed with respect to embodiments of FIGS. 1A and 1B and as described with respect to FIG. 2, introducing the one or more serially connected diodes as illustrated by the three diodes 708, 710, and 712, can fine tune the subthreshold swing of the effective device as presented by the effective drain (the drain 714), gate (the gate 718), and source (the cathode 720). In general, the subthreshold swing increases as the number of serially connected diodes increases. With a relatively large subthreshold swing, high-performance devices and circuits are not required to accurately set and/or read the effective gate-to-source voltage and/or the drain-source current of the sensor device 704.

Although the overall fabrication method and the structures for the disclosed embodiments are entirely novel, certain individual processing steps required to implement the method may utilize conventional semiconductor fabrication techniques and conventional semiconductor fabrication tooling. These techniques and tooling will already be familiar to one having ordinary skill in the relevant arts given the teachings herein. Moreover, many of the processing steps and tooling used to fabricate semiconductor devices are also described in a number of readily available publications, including, for example: James D. Plummer et al., *Silicon VLSI Technology*, Prentice Hall; 2 edition (Nov. 11, 2008); and James D. Plummer et al., *Silicon VLSI Technology: Fundamentals, Practice, and Modeling*, Pearson; 1 edition (Jul. 24, 2000), which are both hereby incorporated by reference herein. It is emphasized that while some individual processing steps are set forth herein, those steps are merely illustrative, and one skilled in the art may be familiar with several equally suitable alternatives that would also fall within the scope of the invention.

It is to be appreciated that the various layers and/or regions shown in the accompanying figures may not be drawn to scale. Furthermore, one or more semiconductor layers of a type commonly used in such integrated circuit devices may not be explicitly shown in a given figure for ease of explanation. This does not imply that the semiconductor layer(s) not explicitly shown are omitted in the actual integrated circuit device.

At least a portion of the techniques of the present invention may be implemented in an integrated circuit. In forming integrated circuits, identical die are typically fabricated in a repeated pattern on a surface of a semiconductor wafer. Each die includes a device described herein, and may include other structures and/or circuits. The individual die are cut or diced from the wafer, then packaged as an integrated circuit. One skilled in the art would know how to dice wafers and package die to produce integrated circuits. Any of the exemplary circuits illustrated in the accompanying figures, or portions thereof, may be part of an integrated circuit. Integrated circuits so manufactured are considered part of this invention.

Those skilled in the art will appreciate that the exemplary structures discussed above can be distributed in raw form (i.e., a single wafer having multiple unpackaged chips), as bare dies, in packaged form, or incorporated as parts of intermediate products or end products that benefit from having sensor devices therein formed in accordance with one or more embodiments of the invention.

The illustrations of embodiments of the invention described herein are intended to provide a general understanding of the various embodiments, and they are not intended to serve as a complete description of all the elements and features of apparatus and systems that might make use of the circuits and techniques described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof. Terms such as "above" and "below" are used to indicate relative positioning of elements or structures to each other as opposed to relative elevation.

The corresponding structures, materials, acts, and equivalents of all means or step-plus-function elements in the claims below are intended to include any structure, material, or act for performing the function in combination with other claimed elements as specifically claimed. The description of the various embodiments has been presented for purposes of illustration and description, but is not intended to be exhaustive or limited to the forms disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the various embodiments with various modifications as are suited to the particular use contemplated.

The abstract is provided to comply with 37 C.F.R. § 1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the appended claims.

What is claimed is:

1. An apparatus, comprising:
   a transistor including a gate, a first terminal, and a second terminal; and
   a set of one or more serially-connected diodes, each diode having a first terminal and a second terminal, wherein the first terminal of a first diode in the set of one or more serially-connected diodes is connected to the second terminal of the transistor, wherein at least one diode in the set of one or more serially-connected diodes comprises:
   a first layer including silicon having a first type of carrier as its majority carrier;
   the first terminal of the at least one diode including a second layer formed on the first layer, the second layer comprising intrinsic amorphous hydrogenated silicon, a third layer formed on the second layer, the third layer comprising amorphous hydrogenated silicon having a second type of carrier as its majority carrier, and a first conductive layer formed on the third layer; and
   the second terminal of the at least one diode comprising a fourth layer formed on the first layer, the fourth layer comprising crystalline hydrogenated silicon having the first type of carrier as its majority carrier, and a second conductive layer formed on the fourth layer;
   wherein the gate of the transistor is not directly connected with the set of one or more serially-connected diodes.

2. The apparatus as set forth in claim 1, the first layer having a doping concentration in a range of $8 \times 10^{16}$ cm$^{-3}$ and $5 \times 10^{18}$ cm$^{-3}$ and having a thickness in a range of 20 nm to 55 nm, the second layer having a thickness in a range of 2 nm to 100 nm, the third layer having a thickness in a range of 5 nm to 15 nm and a doping concentration in a range of $10^{16}$ cm$^{-3}$ to $10^{21}$ cm$^{-3}$.

3. The apparatus as set forth in claim 1, the second, third, and fourth layers each comprising 5 atomic % hydrogen to 40 atomic % hydrogen.

4. The apparatus as set forth in claim 1, wherein at least one diode in the set of one or more serially-connected diodes comprises a diode-connected transistor.

5. The apparatus as set forth in claim 1, wherein the first type of carrier is an electron and the second type of carrier is a hole.

6. The apparatus as set forth in claim 1, wherein the first type of carrier is a hole and the second type of carrier is an electron.

7. The apparatus as set forth in claim 1, further comprising:
    a light-emitting diode, the light-emitting diode coupled in series with the transistor and the set of one or more serially-connected diodes.

8. The apparatus as set forth in claim 1, wherein the transistor is a sensor device.

\* \* \* \* \*